US012598424B2

(12) United States Patent
Rao

(10) Patent No.: US 12,598,424 B2
(45) Date of Patent: Apr. 7, 2026

(54) ZONED AUDIO DUCK FOR IN CAR CONVERSATION

(71) Applicant: Panasonic Automotive Systems Company of America, Division of Panasonic Corporation of North America, Peachtree City, GA (US)

(72) Inventor: Anantha Krishna Chandra Shekar Rao, Farmington, MI (US)

(73) Assignee: Panasonic Automotive Systems America, LLC., Peachtree City, GA (US)

( * ) Notice: Subject to any disclaimer, the term of this patent is extended or adjusted under 35 U.S.C. 154(b) by 243 days.

(21) Appl. No.: 18/476,739

(22) Filed: Sep. 28, 2023

(65) Prior Publication Data

US 2024/0121555 A1 Apr. 11, 2024

Related U.S. Application Data

(60) Provisional application No. 63/413,855, filed on Oct. 6, 2022.

(51) Int. Cl.
| | |
|---|---|
| *H04R 3/12* | (2006.01) |
| *G06T 7/70* | (2017.01) |
| *G10L 25/78* | (2013.01) |
| *H04R 1/02* | (2006.01) |
| *H04R 1/40* | (2006.01) |

(Continued)

(52) U.S. Cl.
CPC .................. *H04R 3/12* (2013.01); *G06T 7/70* (2017.01); *G10L 25/78* (2013.01); *H04R 1/025* (2013.01); *H04R 1/403* (2013.01);

*H04R 1/406* (2013.01); *H04R 3/005* (2013.01); *G06T 2207/10016* (2013.01); *G06T 2207/30201* (2013.01); *G06T 2207/30268* (2013.01); *H03F 3/183* (2013.01); *H03F 2200/03* (2013.01);
(Continued)

(58) Field of Classification Search
CPC .......... H04R 3/005; H04R 3/12; H04R 1/403; H04R 1/406; H04R 2499/13; H03G 3/24
See application file for complete search history.

(56) References Cited

U.S. PATENT DOCUMENTS

| | | | | |
|---|---|---|---|---|
| 9,508,344 B2* | 11/2016 | Srail | ........................ | G10L 25/78 |
| 2010/0177178 A1* | 7/2010 | Burns | .................... | G06V 40/16 |
| | | | | 381/71.8 |

(Continued)

*Primary Examiner* — Jason R Kurr
(74) *Attorney, Agent, or Firm* — Laurence S. Roach, Esq.

(57) ABSTRACT

An audio system is for a motor vehicle having a passenger compartment. The system includes a plurality of microphones disposed in the passenger compartment and each producing a respective microphone signal indicative of audible voices in the passenger compartment. A plurality of loudspeakers are disposed in the passenger compartment and emit sounds based on infotainment audio signals. An audio processor receives the microphone signals, and determines from the microphone signals respective locations of people in the passenger compartment who are participating in a voice conversation. The audio processor modifies the infotainment audio signals sent to individual ones of the loudspeakers based on the determined locations such that the sounds emitted by the loudspeakers are quieter as heard by the people participating in the voice conversation than as heard by at least one other person in the passenger compartment.

20 Claims, 3 Drawing Sheets

Fig. 1

(51) Int. Cl.
    *H04R 3/00*       (2006.01)
    *H03F 3/183*     (2006.01)

(52) U.S. Cl.
    CPC .... *H04R 2201/401* (2013.01); *H04R 2430/01*
            (2013.01); *H04R 2499/13* (2013.01)

(56)            References Cited

U.S. PATENT DOCUMENTS

2019/0230437 A1 *  7/2019  Hirano ..................... H04R 3/02
2021/0204059 A1 *  7/2021  Trestain ................. H04R 3/005
2022/0210593 A1 *  6/2022  Willis ..................... H04S 3/008

* cited by examiner detect speech in a vehicle

102 is the detected speech directed towards another passenger ?

no

104 yes reduce the audio volume level in the seats/zones of the interlocutors

106 detect that the users' conversation has ended

108 increase the audio volume back to the pre-conversation level

110

100 use a plurality of microphones disposed in a passenger compartment to each produce a respective microphone signal indicative of audible voices in the passenger compartment

302 use a plurality of loudspeakers disposed in the passenger compartment to each emit sounds based on infotainment audio signals

304 determine, based upon the microphone signals, respective locations of people in the passenger compartment who are participating in a voice conversation

306 modify the infotainment audio signals sent to individual ones of the loudspeakers based on the determined locations such that the sounds emitted by the loudspeakers are quieter as heard by the people participating in the voice conversation than as heard by at least one other person in the passenger compartment

ZONED AUDIO DUCK FOR IN CAR CONVERSATION

CROSS-REFERENCED TO RELATED APPLICATIONS

This application claims benefit of U.S. Provisional Application No. 63/413,855, filed on Oct. 6, 2022, the disclosure of which is hereby incorporated by reference in its entirety for all purposes.

BACKGROUND OF THE INVENTION

1. Field of the Invention

The present invention relates to an audio system of a motor vehicle.

2. Description of the Related Art

A human driver of a motor vehicle may want to have a conversation with another passenger while he is driving. A problem is that the audio system of the vehicle may be playing, and its volume may be high enough to make it difficult for the driver and passenger to hear each other talk. In this event, the driver typically must manually turn down the volume of the audio system, which diverts his attention from the driving task. Further, when the conversation has ended, the driver must manually turn the audio volume back up.

SUMMARY OF THE INVENTION

The present invention may improve the user experience by automatically ducking (i.e., reducing) the volume of the audio system when conversation is detected between two seating zones. By using zoned audio, beamforming and speech detection, the present invention can reduce user engagement when driving by automatically ducking the audio volume levels.

A motor vehicle of the present invention may include an integrated microphone, may be capable of detecting multi-zone audio, and may be capable of performing beamforming. That is, the vehicle may have a respective microphone for each seat and/or for each seat zone. The microphones may have beamforming capability, enabling the in-vehicle infotainment (IVI) to detect from which seat the speech originated.

The invention comprises, in one form thereof, an audio system for a motor vehicle having a passenger compartment. The system includes a plurality of microphones disposed in the passenger compartment and each producing a respective microphone signal indicative of audible voices in the passenger compartment. A plurality of loudspeakers are disposed in the passenger compartment and emit sounds based on infotainment audio signals. An audio processor determines from the microphone signals respective locations of people in the passenger compartment who are participating in a voice conversation. The audio processor modifies the infotainment audio signals sent to individual ones of the loudspeakers based on the determined locations such that the sounds emitted by the loudspeakers are quieter as heard by the people participating in the voice conversation than as heard by at least one other person in the passenger compartment.

The invention comprises, in another form thereof, a method for controlling an audio system of a motor vehicle, including using a plurality of microphones disposed in the passenger compartment to each produce a respective microphone signal indicative of audible voices in the passenger compartment. A plurality of loudspeakers disposed in the passenger compartment are used to each emit sounds based on infotainment audio signals. Based upon the microphone signals, respective locations of people in the passenger compartment who are participating in a voice conversation are determined. The infotainment audio signals sent to individual ones of the loudspeakers are modified based on the determined locations such that the sounds emitted by the loudspeakers are quieter as heard by the people participating in the voice conversation than as heard by at least one other person in the passenger compartment.

The invention comprises, in yet another form thereof, an audio system for a motor vehicle having a passenger compartment. The system includes a plurality of microphones disposed in the passenger compartment. Each microphone is associated with a respective seat in the passenger compartment and produces a respective microphone signal indicative of audible voices in the passenger compartment. A plurality of loudspeakers are disposed in the passenger compartment. Each loudspeaker is associated with a respective seat in the passenger compartment and emits sounds based on infotainment audio signals. An audio processor determines from the microphone signals which seats are being sat in by people who are participating in a voice conversation. The audio processor modifies the infotainment audio signals sent to individual ones of the loudspeakers based on which of the seats are determined to be sat in by the people who are participating in the voice conversation. The infotainment audio signals are modified such that the sounds emitted by the loudspeakers associated with the seats determined to be sat in by the people who are participating in the voice conversation are of a lower volume than sounds emitted by ones of the loudspeakers associated with ones of the seats being sat in by people who are not participating in the voice conversation.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIG. 3 is a flow chart of one embodiment of a method of the present invention for controlling an audio system of a motor vehicle.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
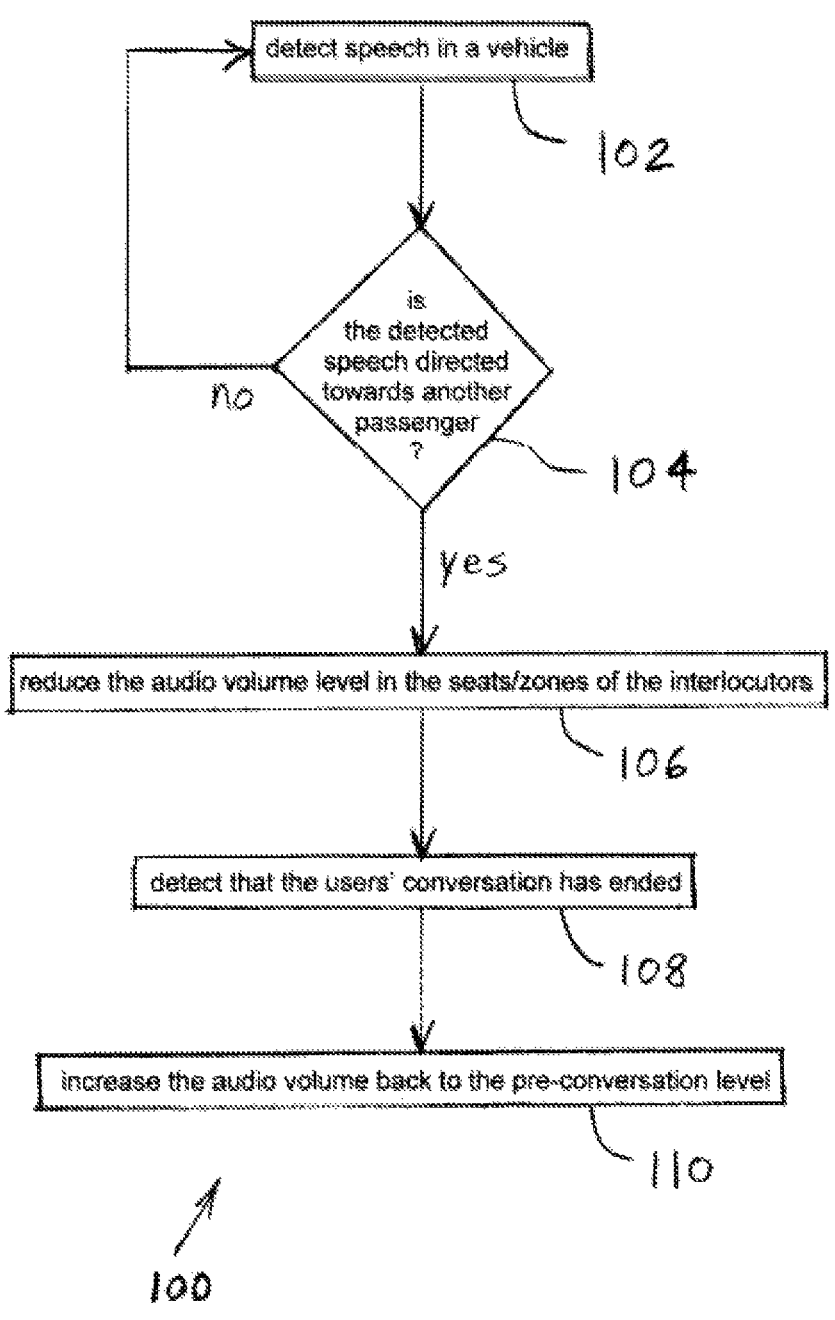
FIG. 1 is a flow chart of one embodiment of a method of the present invention for zoned audio duck for in car conversation.

FIG. 1 illustrates one embodiment of a method 100 of the present invention for zoned audio duck for in car conversation. Each seat or zone in the vehicle may have its own respective microphone and loudspeaker mounted on, adjacent to, or in association with, the seat/zone. A microphone or loudspeaker mounted in association with a particular seat/zone may be closer to that seat/zone than to any of the other seats/zones.

In a first step 102, speech in the vehicle is detected. Speech and silence detection technologies for detecting speech are well known to those of skill in the art. An audio processor may analyze microphone signals and determine that the signals include frequencies and volume consistent with human speech.

In a next step 104, it is determined whether the detected speech is directed towards another passenger. When speaking to another passenger, at least during the beginning of the conversation, a vehicle occupant typically orients their speech/action in such a way that the speech is directed toward the other occupant that they are talking to. A vehicle occupant (other than the driver) may either turn around or look sideways towards another passenger. A driver tends to see the passenger by looking at them either side ways or through the rearview mirror. The person they are looking at can be detected by using beam formers and/or an in-vehicle camera. Using both beam formers and an in-vehicle camera may result in best performance.

If there is no in-car camera, which makes facial detection impossible, then the occupant may be detected using beam formers only. Occupant detection using beam formers may rely on the audio power delivered to different zone microphones. When the driver speaks to the vehicle for wake up word (WuW) and similar speech recognition technology-related action, they tend to look at the road ahead between short peeks at the head unit's main screen to see what action has been taken. On the other hand, when talking to another passenger, the driver tends to either see a rear seat passenger in the mirror. Else, the driver may slightly tilt their head while talking to the passenger. Either way, this results in lower audio power being generated for the driver's microphone, but a slightly higher power being picked up by the front passenger microphone and/or rear microphones.

In the case of facial recognition and action detection, using available machine learning technologies, it can be detected whether the driver is speaking, looking sideways, responding to passengers' comments, etc.

Next, in step 106 the audio volume level is reduced (i.e., ducked). If speech is directed towards a particular passenger, then the background music volume levels are reduced for only the two passenger zones/seats of the two people involved in the conversation. Zoned audio may enable users to isolate audio to individual seats to the greatest extent. When audio volume is ducked for particular seats, users of the vehicle may be able to have seamless conversations without having to engage with in-vehicle infotainment systems or having to disrupt the music experiences of other passengers.

In step 108, it is detected that the user's conversation has ended. Again, speech and silence detection technologies for detecting speech and the lack of it are well known to those of skill in the art.

In a final step 110, at the end of the users' conversation, the volume is returned back to the normal level. Thus, the invention results in an improvement in the form of reduced user action since the user does not need to touch radio buttons to make volume adjustments, which makes driving safer. Another advantage is that user annoyance is reduced as natural human behavior is accommodated, and the user does not need to take action in order to talk to another passenger, thereby improving the user experience.

Figure 2:
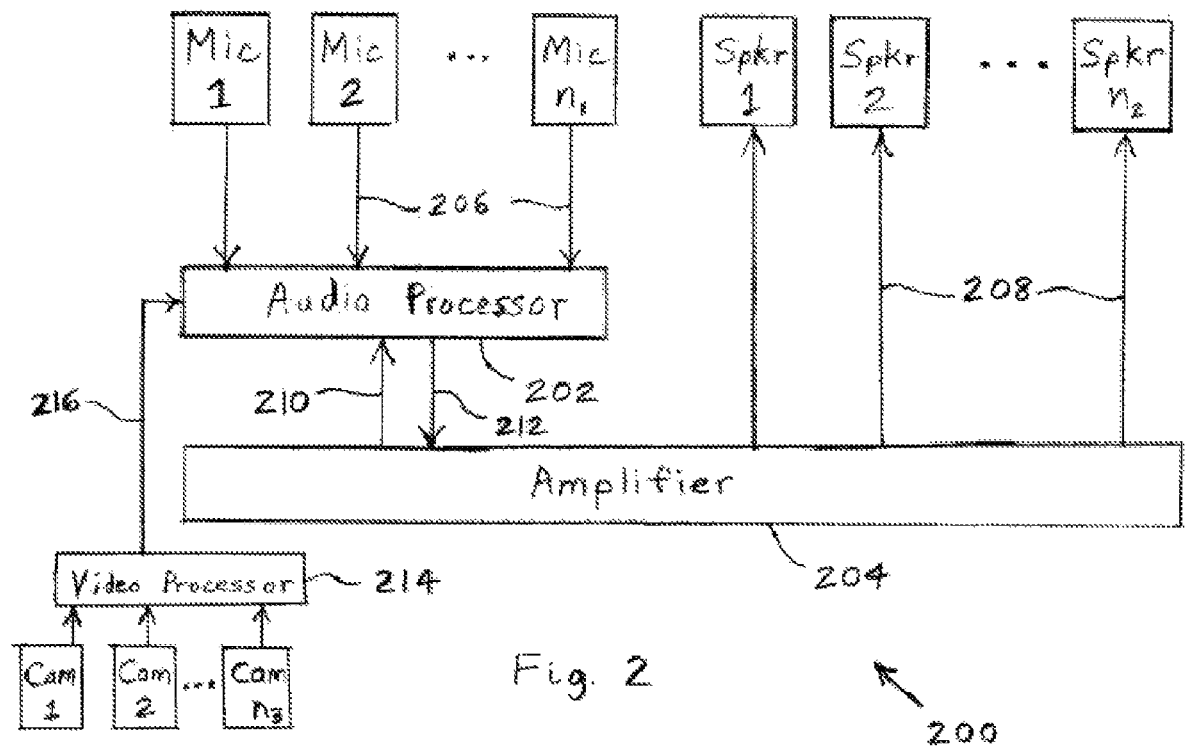
FIG. 2 is a block diagram of one embodiment of a zoned audio ducking arrangement of the present invention.

FIG. 2 illustrates one embodiment of a zoned audio ducking arrangement 200 of the present invention, including microphones $1-n_1$, loudspeakers $1-n_2$, an audio processor 202, and an amplifier 204. Zoned audio ducking arrangement 200 may also possibly include cameras $1-n_3$ and a video processor 214.

During use, microphones $1-n_1$ transmit signals 206 to audio processor 202 indicative of the sounds picked up by the microphones, as is conventionally known. Based on these signals, processor 202 determines which seats/zones associated with microphones $1-n_1$ are occupied by people participating in a conversation. For example, processor 202 may determine that the loudest voices are being detected by microphones 2 and 4 (and possibly that both microphones 2 and 4 are each detecting two different loud voices), and thus the occupants of seats/zones 2 and 4 are having a conversation. Additionally, video processor 214 may transmit signals 216 to audio processor 202 to indicate that images captured by video cameras $1-n_3$ indicate that one or more of the people involved in the conversation are looking at at least one other participant in the conversation, thereby indicating or confirming that a conversation between passengers is taking place.

So that the people having the conversation can hear each other better, processor 202 may transmit signals 212 to control amplifier 204 to transmit signals 208 to speakers 2 and 4 that cause the audio volume of the music or other content being played by speakers 2 and 4 to be reduced. Amplifier 204 may transmit reference signal 210 to audio processor 202 to inform processor 202 about the current state of signals 208 being sent to the speakers. Once processor 202 determines, based on the signals 206 from the microphones, that the conversation has ended, processor 202 may cause amplifier 204, via signals 212, to transmit signals 208 to speakers 2 and 4 that cause the audio volume of the music or other content being played by speakers 2 and 4 to be increased back to the previous level that was in effect before the conversation was detected.

Figure 3:
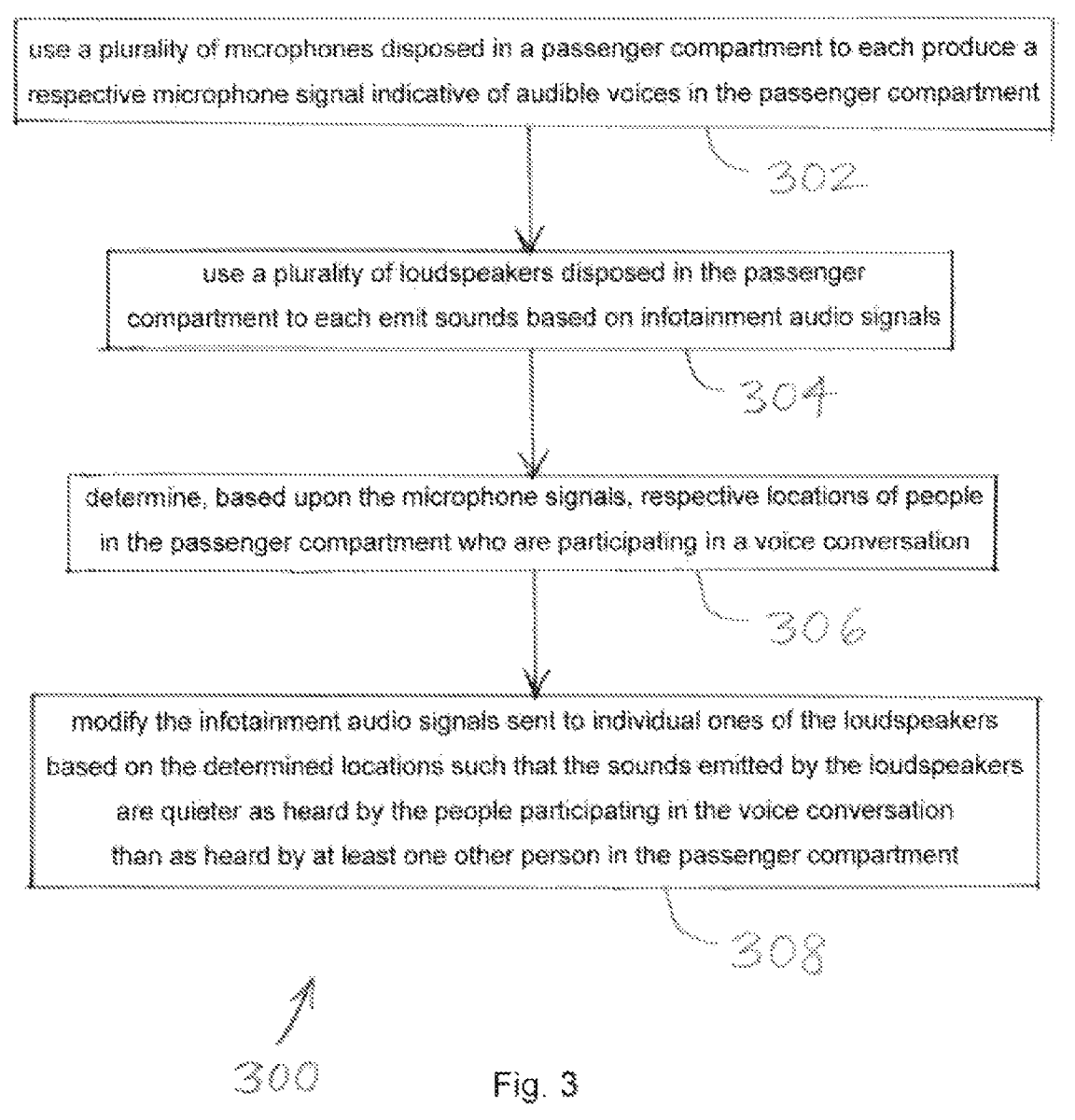

FIG. 3 illustrates one embodiment of a method 300 of the present invention for controlling an audio system of a motor vehicle. In a first step 302, a plurality of microphones disposed in the passenger compartment are used to each produce a respective microphone signal indicative of audible voices in the passenger compartment. For example, microphones $1-n_1$ are disposed in a passenger compartment of a motor vehicle and produce microphone signals 206 indicative of the sounds in the passenger compartment picked up by the microphones.

Next, in step 304, a plurality of loudspeakers disposed in the passenger compartment are used to each emit sounds based on infotainment audio signals. For example, loudspeakers $1-n_2$ are disposed in the passenger compartment and may emit sounds based on infotainment audio signals 208.

In a next step 306, it is determined, based upon the microphone signals, respective locations of people in the passenger compartment who are participating in a voice conversation. For example, processor 202 may determine that the loudest voices are being detected by microphones 1 and 3 (and possibly that both microphones 1 and 3 are each detecting two different loud voices), and thus the occupants of seats/zones 1 and 3 are having a conversation.

In a final step 308, the infotainment audio signals sent to individual ones of the loudspeakers are modified based on the determined locations such that the sounds emitted by the loudspeakers are quieter as heard by the people participating in the voice conversation than as heard by at least one other person in the passenger compartment. For example, so that the people having the conversation can hear each other better, processor 202 may transmit signals 212 to control amplifier 204 to transmit signals 208 to speakers 1 and 3 that cause the audio volume of the music or other content being played by speakers 1 and 3 to be reduced.

The invention has been described as lowering the audio volume of all frequencies for people involved in a conversation. However, in another embodiment, only the loudspeaker frequencies matching the frequencies of human voices, or perhaps matching the frequencies of the voices of the particular people involved in the conversation, have their volumes lowered.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. An audio system for a motor vehicle having a passenger compartment, the system comprising:
   a plurality of microphones disposed in the passenger compartment and configured to each produce a respective microphone signal indicative of audible voices in the passenger compartment;
   a plurality of loudspeakers disposed in the passenger compartment and configured to emit sounds based on infotainment audio signals; and
   an audio processor configured to:
      receive the microphone signals;
      determine from the microphone signals that a driver is talking to another person in the passenger compartment, the determining including ascertaining that the driver is looking at a rearview mirror and/or tilting their head;
      determine from the microphone signals a location of the person in the passenger compartment that the driver is talking to; and
      modify the infotainment audio signals sent to individual ones of the loudspeakers based on the location of the person in the passenger compartment that the driver is talking to such that the sounds emitted by the loudspeakers are quieter as heard by the driver and the person in the passenger compartment that the driver is talking to than as heard by at least one other person in the passenger compartment.

2. The system of claim 1 wherein the infotainment audio signals are modified such that the sounds emitted by ones of the loudspeakers closest to the driver and the person in the passenger compartment that the driver is talking to are quieter than the sounds emitted by other ones of the loudspeakers.

3. The system of claim 1 wherein the audio processor is configured to:
   ascertain from the microphone signals that the driver is no longer talking to the other said person in the passenger compartment; and
   in response to the ascertaining, return the loudspeakers to their respective volume levels that were in effect before the infotainment audio signals were modified.

4. The system of claim 1 further comprising:

a plurality of cameras disposed in the passenger compartment and configured to each capture images of the people in the passenger compartment; and
   a video processor configured to:
      ascertain, based on the captured images, that the driver is talking to the other person in the passenger compartment; and
      transmit a signal to the audio processor indicative of which of the people are participating in the voice conversation.

5. The system of claim 4 wherein the video processor is configured to ascertain that the driver is looking the other person in the passenger compartment in a rearview mirror while talking to the other person in the passenger compartment.

6. The system of claim 1 wherein the microphones comprise beamforming microphones.

7. A method for controlling an audio system of a motor vehicle, the method comprising:
   using a plurality of loudspeakers disposed in a passenger compartment of the motor vehicle to each emit sounds based on infotainment audio signals;
   capturing images of occupants in the passenger compartment;
   determining, based upon a direction in which an occupant is looking in the captured images, that an occupant of the passenger compartment is talking to another occupant of the passenger compartment;
   ascertaining, based upon the direction in which the talking occupant is looking in the captured images, a location of the other occupant who is being talked to; and
   modifying the infotainment audio signals sent to individual ones of the loudspeakers based on the determined locations such that the sounds emitted by the loudspeakers are quieter as heard by the occupant who is talking and the other occupant who is being talked to than as heard by at least one other person in the passenger compartment.

8. The method of claim 7 wherein the infotainment audio signals are modified such that the sounds emitted by ones of the loudspeakers closest to the occupant who is talking and the other occupant who is being talked to are quieter than the sounds emitted by other ones of the loudspeakers.

9. The method of claim 7 further comprising:
   communicatively coupling an amplifier to the loudspeakers:
   transmitting control signals to the amplifier to thereby modify the infotainment audio signals sent to individual ones of the loudspeakers.

10. The method of claim 7 further comprising:
   using a plurality of microphones disposed in the passenger compartment to each produce a respective microphone signal indicative of audible voices in the passenger compartment;
   ascertaining from the microphone signals that the driver is no longer talking to the other said person in the passenger compartment; and
   in response to the ascertaining, returning the loudspeakers to their respective volume levels that were in effect before the infotainment audio signals were modified.

11. The method of claim 7 wherein the determining that an occupant of the passenger compartment is talking to another occupant of the passenger compartment is dependent upon the occupant who is talking looking at a rearview mirror in the captured images.

12. The method of claim 7 further comprising using a plurality of microphones disposed in the passenger compartment to each produce a respective microphone signal indicative of audible voices in the passenger compartment, wherein the microphone signals are used in ascertaining the locations of the occupant who is talking and of the other occupant who is being talked to.

13. The method of claim 7 wherein the determining step comprises ascertaining an orientation of a head of the occupant who is talking.

14. An audio system for a motor vehicle having a passenger compartment, the system comprising:

a plurality of cameras disposed in the passenger compartment and configured to each capture images of people in the passenger compartment;

a plurality of loudspeakers disposed in the passenger compartment and each associated with a respective said seat in the passenger compartment, each said loudspeaker being configured to emit sounds based on infotainment audio signals; and at least one processor configured to:

receive the captured images;

determine that one of the people in the passenger compartment is talking to another person in the passenger compartment, the determining including detecting an action by the talking person in the captured images;

ascertain which seats in the passenger compartment are being sat in by the person who is talking and the other person who is being talked to; and modify the infotainment audio signals sent to individual ones of the loudspeakers based on which of the seats are ascertained to be sat in by the person who is talking and the other person who is being talked to, the infotainment audio signals being modified such that the sounds emitted by the loudspeakers associated with the seats ascertained to be sat in by the person who is talking and the other person who is being talked to are of a lower volume than sounds emitted by ones of the loudspeakers associated with ones of the seats being sat in by at least one other person in the passenger compartment.

15. The system of claim 14 wherein the at least one processor is configured to:

ascertain from the captured images that the person is no longer talking to the other person; and in response to the ascertaining that the person is no longer talking to the other person, return the loudspeakers to their respective volume levels that were in effect before the infotainment audio signals were modified.

16. The system of claim 14 wherein the determining is based upon detecting a direction in which the one person in the passenger compartment is looking in the captured images.

17. The system of claim 14 wherein the detected action by the talking person comprises the talking person turning around.

18. The system of claim 14 wherein the detected action by the talking person comprises the talking person looking sideways.

19. The system of claim 14 wherein the determining includes detecting that the talking person is tilting their head.

20. The system of claim 14 wherein the determining includes detecting that the talking person is looking at the other person who is being talked to in a rearview mirror.

* * * * *